United States Patent [19]

Luthi et al.

[11] 4,329,642
[45] May 11, 1982

[54] CARRIER AND TEST SOCKET FOR LEADLESS INTEGRATED CIRCUIT

[75] Inventors: Robert B. Luthi, San Jose; Clair E. Williams, Sunnyvale, both of Calif.

[73] Assignee: Siliconix, Incorporated, Santa Clara, Calif.

[21] Appl. No.: 18,869

[22] Filed: Mar. 9, 1979

[51] Int. Cl.³ .................... G01R 31/02; H05K 1/12; B65D 81/06

[52] U.S. Cl. .................... 324/158 F; 206/328; 206/509; 324/158 P; 339/17 CF

[58] Field of Search .................... 324/158 F, 158 P; 339/17 R, 17 C, 17 CF, 174; 174/52 FP

[56] References Cited

U.S. PATENT DOCUMENTS 3,319,166  5/1967  Coleman ........................... 339/174
3,984,620 10/1976  Robillard et al. ............... 324/158 F

OTHER PUBLICATIONS

Shipper-Tester–I. C. Flat Packs; Part No. 5124; Azimuth Electronics, Denville, N.J.
LCS Series leadless IC Socket Data Sheet; Robinson-Nugent, Inc., New Albany, Ind.
Leadless Package Test Socket, Part. No. 6040-28, Azimuth Electronics, Denville, N. J.
Series 6040 Test Socket Data Sheet, Azimuth Electronics, Denville, N. J.
Chip Carrier Socket No. TD-4270 Data Sheet; Textool Products, Inc., Irving, Texas.

*Primary Examiner*—Ernest F. Karlsen
*Attorney, Agent, or Firm*—Flehr, Hohbach, Test

[57] ABSTRACT

A carrier and test socket for a leadless integrated circuit package includes a base portion having a cavity for receiving the integrated circuit and a plurality of leads on a surface and extending from the cavity. The leads are arranged to mate with contacts of test equipment, and a portion of each lead is cantilevered into the cavity and arranged to mate with contacts of the integrated circuit. The carriers are configured to facilitate stacking, and a retainer member is provided for retaining the integrated circuit in the carrier while being individually handled.

3 Claims, 16 Drawing Figures

U.S. Patent May 11, 1982 Sheet 1 of 4 4,329,642
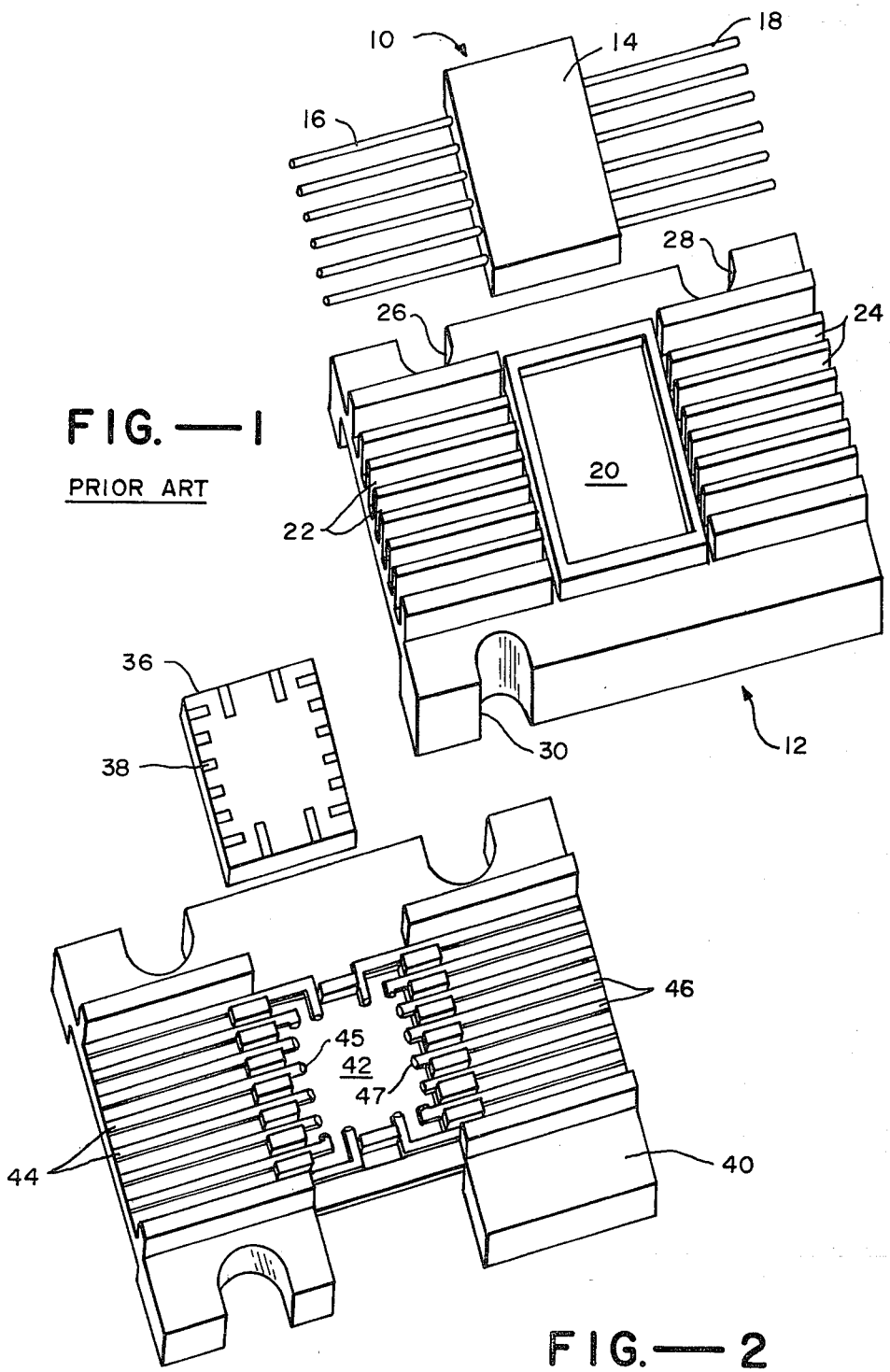
FIG.—1
PRIOR ART
FIG.—2

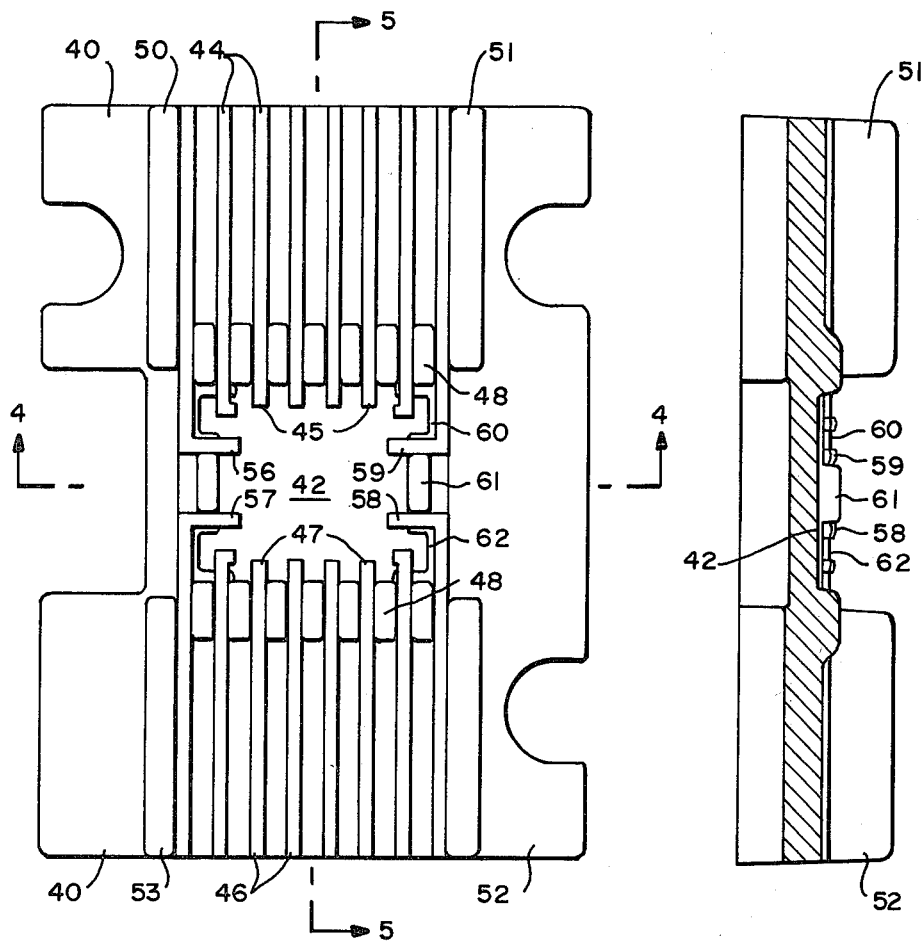

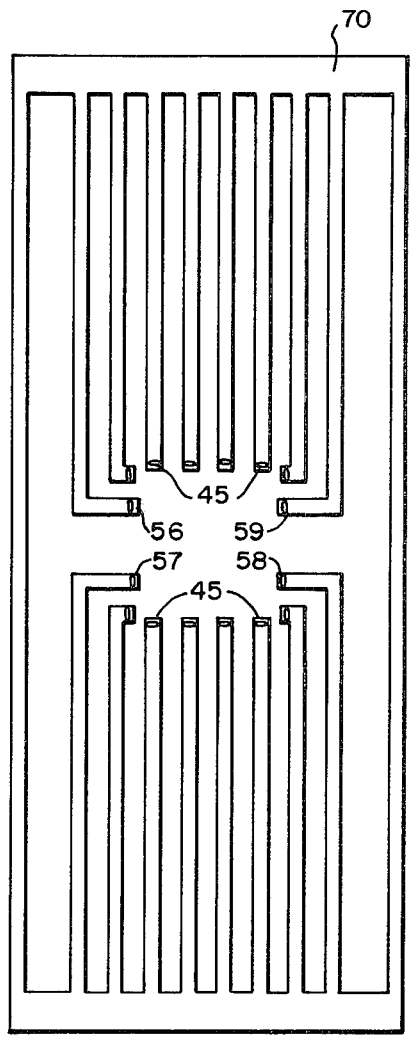
FIG.—6
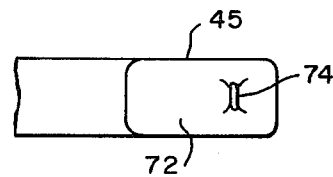
FIG.—7
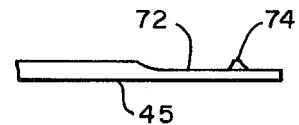
FIG.—8
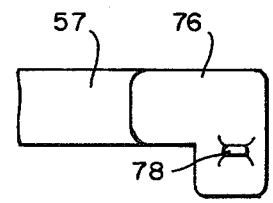
FIG.—9
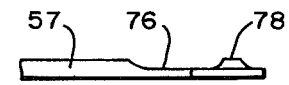
FIG.—10
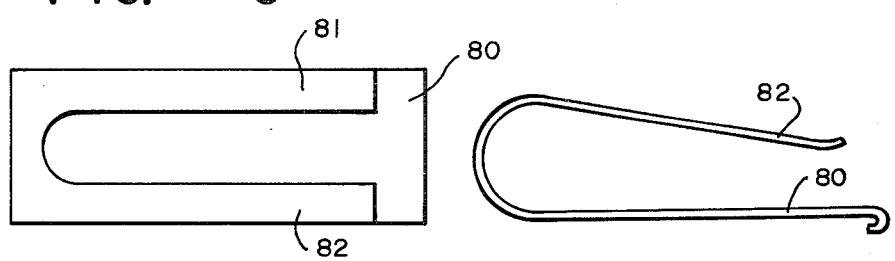
FIG.—11  FIG.—12

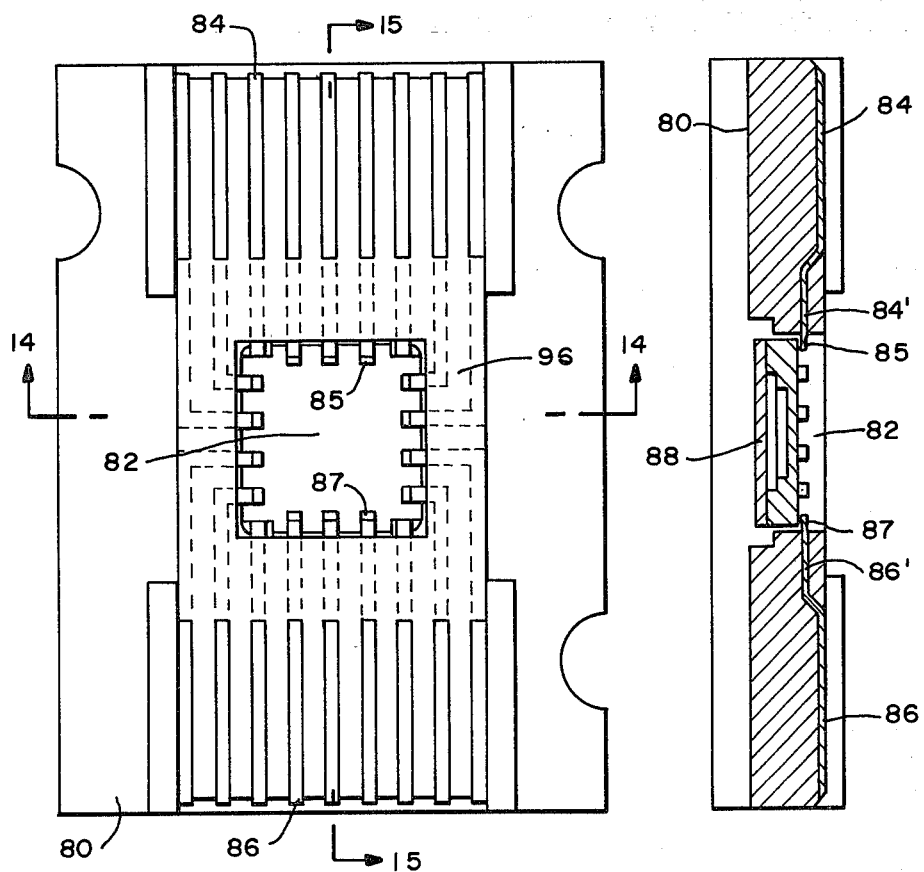
FIG.—14
FIG.—13  FIG.—15
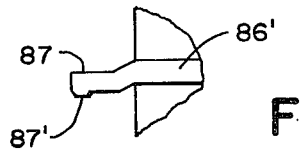
FIG.—16

CARRIER AND TEST SOCKET FOR LEADLESS INTEGRATED CIRCUIT

This invention relates generally to packages for electrical devices such as semiconductor integrated circuits, and more particularly the invention relates to carriers and test sockets for semiconductor integrated circuits and the like.

Semiconductor integrated circuits are small and relatively fragile devices. Accordingly, carriers are normally provided to facilitate shipping and handling of the devices without consequent damage. Advantageously, the carriers can be designed to serve also as sockets for electrically testing the circuits without the requirement for removing the devices from the carrier.

A conventional integrated circuit package is referred to as the dual in-line (DIP) or flat pack package. The DIP includes an encapsulated semiconductor chip having a plurality of leads extending from opposite sides of the encapsulated chip. Carriers are commercially available for shipping and handling the DIP package. Moreover, test equipment is available which accommodates the carriers as sockets for electrical testing of the integrated circuit package therein.

Recently, leadless integrated circuit packages have been developed. While these packages offer distinct advantages in assembly and in mounting the integrated circuits on interconnect boards, the absence of leads presents difficulty in testing the circuits. Since most test equipment is designed to accommodate the DIP or flat pack integrated circuit and carrier therefor, special adapters and/or individual circuit handling is required.

An object of the present invention is a carrier and test socket for a leadless integrated circuit package.

Another object of the invention is a leadless integrated circuit carrier and testing socket which is compatible with test equipment for dual in-line packages.

Still another object of the invention is an improved integrated circuit carrier which permits stacking of integrated circuit devices and is compatible with automated device handling equipment.

Briefly, in accordance with the present invetion, a leadless integrated circuit carrier and test socket includes a base, a circuit receiving cavity disposed in a central portion of the base, and a plurality of electrically conductive leads disposed on a major surface of the base and affixed thereto. The leads are arranged to mate with contacts of test equipment, and a cantilever portion of each of the leads projects into the cavity. Each of the cantilever portions includes a contact area with the contact areas cooperatively arranged to mate with contacts of the integrated circuit.

The carrier and test socket preferably includes means for retaining the integrated circuit in the cavity and in pressure contact with the cantilever portions of the leads. In preferred embodiments the retaining means includes a clip or a cover which latches to the base.

Advantageously, the top surface and bottom surface of each carrier and test socket is configured whereby a plurality of carriers and sockets can be stacked. Further, the carrier and test socket includes means for facilitating alignment thereof with test equipment and means to facilitate reception thereof by automated production equipment.

The invention and objects and features thereof will be more readily apparent from the following detailed description and appended claims when taken with the drawings.

In the drawings, FIG. 1 is an exploded perspective view of a prior art semiconductor package and carrier.

FIG. 2 is an exploded perspective view of a semiconductor circuit and one embodiment of a carrier therefor in accordance with the present invention.

FIG. 3 is a plan view of the carrier shown in FIG. 2.

FIG. 4 is a section view of a carrier shown in FIG. 3 taken along the line 4—4.

FIG. 5 is a section view of the carrier shown in FIG. 3 taken along the line 5—5.

FIG. 6 is a plan view of a lead frame useful in a carrier in accordance with the present invention.

FIG. 7 and FIG. 8 are a top view and side view, respectively, of a contact in the lead frame of FIG. 6.

FIG. 9 and FIG. 10 are a top view and a side view, respectively, of another contact in the lead frame of FIG. 6.

FIG. 11 and FIG. 12 are a top view and side view respectively of one embodiment of a clip useful with a carrier in accordance with the present invention.

FIG. 13 is a plan view of another embodiment of a carrier in accordance with the present invention.

FIG. 14 is a section view of the carrier illustrated in FIG. 13 taken along the line 14—14.

FIG. 15 is a section view of the carrier of FIG. 13 taken along the line 15—15.

FIG. 16 is a side view of a contact in the carrier of FIGS. 13–15.

Referring now to the drawings, FIG. 1 is an exploded perspective view of a prior art semiconductor package shown generally at 10 and carrier shown generally at 12. Package 10 is of the conventional dual in-line configuration and includes a flat-pack portion 14 including an encapsulated integrated circuit and a plurality of leads 16 and 18 which extend from opposiing sides of flat-pack 14. In final configuration the leads 16 and 18 would be bent ninety degrees and extend downwardly with the leads trimmed for attachment to an interconnect board. However, the circuit is normally packaged and tested in the shown configuration.

The carrier 12 is typically made of injection molded plastic and includes a centrally disposed opening 20 of suitable configuration for receiving the flat pack 14 of package 10. A plurality of guides 22 and 24 are provided on opposing sides of cavity 20 for receiving the leads 16 and 18, respectively, of package 10. Each guide comprises a channel having a base surface for receiving a lead and a pair of sidewalls for retaining and protecting the lead while the package is in the carrier. Grooves 26, 28 and 30 are provided in the sides of carrier 12 for aligning the carrier in automated test and assembly equipment.

As above noted, automated test equipment is designed to accommodate the carrier 12 as a socket for electrically testing an integrated circuit packaged therein, and the test equipment typically has a plurality of leads which are configured to mate with the leads 16 and 18 of the integrated circuit package. However, the test equipment will not accommodate the leadless integrated circuit package which has recently been introduced.

FIG. 2 is an exploded perspective view of a leadless integrated circuit package and one embodiment of a carrier therefor in accordance with the present invention. The integrated circuit package 36 is similar to the flat pack 14 of the dual in-line package shown in FIG. 1 with the exception that contacts 38 are provided on the bottom surface of package 36 which are interconnected to the integrated circuit sealed within package 36. The package eliminates the need for extended leads and offers distinct advantages in assembly and in mounting the integrated circuit on interconnect boards. However, the leadless package cannot be accommodated in the conventional carrier for electrical testing.

In accordance with one embodiment of the invention, a carrier 40 is provided with a central cavity 42 of suitable configuration for receiving the leadless package 36 and allowing electrical testing thereof with the carrier functioning as a test socket. The carrier includes a plurality of leads 44 and 46 provided on opposing sides of cavity 42 and extending therefrom. Each of the leads 44, 46 includes a cantilevered portion 45 and 47, respectively, which extend into the cavity 42 in suitable configuration for mating with the contacts 38 of the leadless package 36. As will be described further hereinbelow, the carrier is preferably provided with retaining means for maintaining the package 46 in cavity 42 with the integrated circuit contacts 38 in pressure engagement with the contacts 45, 47 of the carrier. The carrier may be made of injection molded plastic such as Minlon plastic of DuPont Corporation or a ceramic such as alumina loaded glass.

FIG. 3 is a plan view of the carrier shown in FIG. 2 and FIGS. 4 and 5 are section views of the carrier taken along lines 4—4 and 5—5, respectively, in FIG. 3. The leads 44, 46 are attached to the carrier body 40 by suitable means such as epoxy preform or epoxy adhesive, with raised portions or castellations 48 on the top surface of carrier 40 provided for aligning the leads 44, 46 with respect ot cavity 42 and also for aligning the leadless chip package in the cavity.

Larger castellations 50, 51, 52 and 53 on the top surface of the carrier 40 mate with the concave portion 54 on the bottom surface of carrier 40 and facilitate the stacking of carriers for handling and shipping. As shown in FIG. 4, a small groove 54 is provided in the bottom surface of carrier 40 and extends the length thereof and is utilized as a guide in automated assembly equipment. As shown in FIG. 4 the contacts 45 are cantilevered slightly above the bottom surface of cavity 42 whereby the contacts may be flexed when receiving in pressure engagement the contacts of a carrier.

As shown in FIG. 3, the contacts 56, 57, 58 and 59 mate with the end contacts of a leadless package and are provided on leads which are configured to extend outwardly from cavity 42 in parallel with the leads 44 and 46. The side view in cross section shown in FIG. 5 shows contacts 58 and 59 positioned between castellations 60, 61 and 62 with contacts 58 and 59 spaced from the bottom surface of cavity 52.

FIG. 6 is a plan view of a lead frame useful in fabricating the carrier illustrated in FIGS. 2-5. The lead frame 70 is formed from a sheet of material such as beryllium copper by photoresist masking and chemically etching the plate to form the desired lead pattern. Alternatively, the lead pattern can be formed by stamping a blank plate utilizing a stamping tool of the desired pattern configuration. The lead frame includes 16 leads and contacts, however a larger number of leads or a fewer number or leads could be utilized, as desired.

Each of the contacts is shaped to provide a raised contact portion which facilitates proper mechanical and electrical contact with an integrated circuit. FIG. 7 and FIG. 8 are a top view and a side view, respectively, of one of the contacts 45. The end portion 72 of contact 45 is shaped by chemical etching or by coining so that a raised contact portion 74 extends above the surface portion 72 to facilitate engagement with the integrated circuit package contact.

Similarly, FIG. 9 and FIG. 10 are a top view and a side view, respectively, of contact 57 in which the end portion 76 has been reduced in thickness by chemical etching or by coining whereby a raised portion 78 extends therefrom for providing electrical and mechanical contact with a corresponding contact on an integrated circuit.

After positioning a leadless integrated circuit in the carrier 40, means is preferably provided for maintaining the position of the circuit in the carrier and facilitating the testing of the circuits while in the carrier. FIG. 11 and FIG. 12 are a top view and a side view, respectively, of one embodiment of a clip useful with a carrier in accordance with the present invention. The clip comprises a strip 80 of resilient material such as steel which has been formed and stamped to define two extending arms 81 and 82. The clip is easily applied to the integrated circuit and carrier and does not interfere with electrical tests of the chip while in the carrier. The clip is useful particularly when handling the individual chips and carriers. Chips are maintained in their respective carriers in a stacked array by nesting arrangement of adjacent and abutting carriers.

FIG. 13 is a plan view of another embodiment of a carrier in accordance with the present invention, and FIGS. 14 and 15 are section views of the carrier taken along the lines 14—14 and 15—15, respectively. The carrier 80 has a centrally positioned cavity 82 which extends therethrough with a plurality of leads 84 and 86 extending in opposing directions from cavity 82. Contacts 85 at the tips of leads 84 and contacts 87 at the tips of leads 86 extend into cavity 82 in cantilever fashion for receiving mating contacts of the integrated circuit package.

As illustrated in FIG. 14, an integrated circuit 88 is received in cavity 82 through the bottom of carrier 80, and a cover 90 is provided for maintaining the integrated circuit in position in cavity 82. Cover 90 includes two resilient arms 91 and 92 which can be inserted and locked in notches 93 and 94 in the bottom wall portion of cavity 82. Similar to the package shown in FIGS. 2-5, carrier 80 is provided with castellons 98 which receive the concave surface 99 on the bottom of a carrier in a stacked array.

As illustrated in the cross section view of FIG. 15, the leads 84 and 86 are formed with offset portions 84' and 86' which extend into cavity 82. The portion 96 of carrier 80 which overlies the offset portions 84' and 86' of leads 84 and 86 may be fused to the remaining portion of the carrier body 80 after placement of the leads 84, 86 on the carrier body 80.

As shown in FIG. 16, the contact portion 87 of lead 86' is offset downwardly to receive the corresponding contact of the semiconductor package. Again, the contact 87 is shaped by chemical etching or by coining to provide an outstanding contact area 87' on the surface which receives the contact of the integrated circuit package. Thus, an integrated circuit is maintained in the carrier 80 by means of cover 90 with the circuit contacts in pressure engagement with the contact points 87' of contact 87.

Carriers in accordance with the present invention have proved to be durable and protective of leadless integrated circuit packages and facilitate handling and testing of the leadless circuit packages. Circuit packages can be handled by standard high volume production equipment, and individual handling of packages can be accommodated with minimal risk of contaminating the integrated circuit therein.

While the invention has been described with reference to specific embodiments, the description is illustrative of the invention and is not to be construed as limiting the invention. Various modifications and applications will occur to those skilled in the art without departing from the true spirit and scope of the invention as defined by the appended claims.

What is claimed is:

1. A leadless integrated circuit carrier and test socket comprising a base, a circuit receiving cavity disposed in a central portion of said base, a plurality of electrically conductive leads disposed on a major surface of said base and affixed thereto, said body leads arranged to mate with contacts of test means, a cantilever portion of each of said leads projecting into said cavity, each of said cantilever portions including a contact area with the contact areas cooperatively arranged to mate with contacts on said integrated circuit means for retaining an integrated circuit in said cavity and in pressure contact with said cantilever portions of said leads, the top surface of said base having a raised portion, the bottom surface of said base having a recessed portion whereby a plurality of carriers and sockets can be stacked with the raised portion of one carrier and socket mating with the recessed portion of an adjacent carrier and socket.

2. A carrier and test socket as defined in claim 1 wherein said bottom surface includes guide means for reception by automated production equipment.

3. A carrier and test socket as defined by claim 2 wherein at least two sides thereof include notches to facilitate alignment of said carrier and socket with test equipment.

* * * * *

UNITED STATES PATENT AND TRADEMARK OFFICE
CERTIFICATE OF CORRECTION

PATENT NO. : 4,329,642
DATED : May 11, 1982
INVENTOR(S) : Robert B. Luthi
Clair E. Williams It is certified that error appears in the above—identified patent and that said Letters Patent is hereby corrected as shown below:

Column 1, line 18, delete "dual in-line (DIP) or";
        line 19, change "DIP" to --flat pack package--;
        line 22, change "DIP" to --flat pack--;
        line 31, delete DIP or";
        line 38, change "dual in-line" to --flat pack--;
Column 2, line 34, change "dual in-line to --flat pack--;
        line 38, delete "In final configuration the leads 16 and 18";
        lines 39 and 40, delete in their entirety;
        line 41, delete "nect board. However," change "the" to --The--;
        line 68, delete "dual in-line";
Column 6, line 4, after "circuit" insert --,-- (comma).

Signed and Sealed this

Twenty-sixth Day of October 1982

[SEAL]

Attest:

GERALD J. MOSSINGHOFF
Attesting Officer    Commissioner of Patents and Trademarks